(12) United States Patent
Jung et al.

(10) Patent No.: US 9,890,281 B2
(45) Date of Patent: Feb. 13, 2018

(54) THERMOPLASTIC RESIN COMPOSITION FOR LASER DIRECT STRUCTURING AND MOLDED ARTICLE COMPRISING THE SAME

(71) Applicant: Samsung SDI Co., Ltd., Yongin-si (KR)

(72) Inventors: Yoo Jin Jung, Uiwang-si (KR); Eun Taek Woo, Uiwang-si (KR); Jung Ki Kim, Uiwang-si (KR); Na Ri Park, Uiwang-si (KR); Sang Hyun Hong, Uiwang-si (KR)

(73) Assignee: Lotte Advanced Materials Co., Ltd., Yeosu-si (KR)

( * ) Notice: Subject to any disclaimer, the term of this patent is extended or adjusted under 35 U.S.C. 154(b) by 16 days.

(21) Appl. No.: 14/977,895

(22) Filed: Dec. 22, 2015

(65) Prior Publication Data
US 2016/0185958 A1    Jun. 30, 2016

(30) Foreign Application Priority Data

Dec. 24, 2014 (KR) .......................... 10-2014-0188115

(51) Int. Cl.
| | |
|---|---|
| *B32B 3/00* | (2006.01) |
| *C08L 69/00* | (2006.01) |
| *H05K 3/00* | (2006.01) |
| *H05K 3/18* | (2006.01) |

(52) U.S. Cl.
CPC ............ *C08L 69/00* (2013.01); *H05K 3/0014* (2013.01); *H05K 3/0032* (2013.01); *H05K 3/182* (2013.01); *C08L 2205/16* (2013.01); *C08L 2207/04* (2013.01)

(58) Field of Classification Search
CPC .. C08L 69/00; C08L 2205/16; C08L 2207/14; H05K 3/0014; H05K 3/0032; H05K 3/182

See application file for complete search history.

(56) References Cited

U.S. PATENT DOCUMENTS

| 8,664,322 B2 | 3/2014 | Lee et al. | |
|---|---|---|---|
| 2014/0066560 A1 | 3/2014 | Stoppelmann et al. | |
| 2015/0005426 A1 | 1/2015 | Stoppelmann et al. | |
| 2015/0175803 A1* | 6/2015 | Stoppelmann ........... | C08K 3/22 428/35.7 |
| 2015/0175804 A1* | 6/2015 | Aepli ...................... | C08K 3/24 428/35.7 |
| 2015/0210849 A1 | 7/2015 | Motegi et al. | |
| 2016/0272788 A1 | 9/2016 | Stoppelmann et al. | |

FOREIGN PATENT DOCUMENTS

| CN | 101367990 A | 2/2009 |
|---|---|---|
| CN | 102690505 A | 9/2012 |
| CN | 103665831 A | 3/2014 |
| CN | 103694704 A | 4/2014 |
| CN | 104269348 A | 1/2015 |
| JP | 2014-074161 A | 4/2014 |
| KR | 10-2008-0029891 A | 4/2008 |
| WO | 2014/115475 A1 | 7/2014 |

OTHER PUBLICATIONS

Office Action in counterpart Korean Application No. 10-2014-0188115 dated Apr. 3, 2017, pp. 1-13.
Office Action in counterpart Chinese Application No. 201510977802.2 dated Mar. 16, 2017, pp. 1-10.

\* cited by examiner

*Primary Examiner* — Elizabeth E Mulvaney
(74) *Attorney, Agent, or Firm* — Additon, Higgins & Pendleton, P.A.

(57) ABSTRACT

A thermoplastic resin composition for laser direct structuring and a molded article including the same. The thermoplastic resin composition includes: (A) a thermoplastic resin; (B) a laser direct structuring additive; and (C) an olefin copolymer.

21 Claims, No Drawings

THERMOPLASTIC RESIN COMPOSITION FOR LASER DIRECT STRUCTURING AND MOLDED ARTICLE COMPRISING THE SAME

CROSS-REFERENCE TO RELATED APPLICATION

This application claims priority to and the benefit of Korean Patent Application No. 10-2014-0188115, filed on Dec. 24, 2014 in the Korean Intellectual Property Office, the entire disclosure of which is incorporated herein by reference.

FIELD

The present invention relates to a thermoplastic resin composition and a molded article including the same. More particularly, the present invention relates to a thermoplastic resin composition for laser direct structuring, which can have excellent stiffness and fluidity, and a molded article including the same.

BACKGROUND

Thermoplastic resins exhibit excellent physical properties, such as low specific gravity, good moldability, and good impact resistance, as compared with glass or metal. Plastic products made of such thermoplastic resins are quickly replacing existing glass or metal-based products.

Recently, a laser direct structuring process of adding a material allowing laser direct structuring to a thermoplastic resin or the like has been used to form fine patterns at a desired location.

Particularly, laser direct structuring is widely used in the manufacture of a smartphone antenna, since such an antenna requires a separate electrode for each frequency bandwidth and it is difficult to realize a fine pattern suitable for a corresponding frequency bandwidth.

Advantageously, such a laser direct structuring process can realize fine patterns at a desired location and thus increase the degree of freedom of design of an antenna and the like. However, the laser direct structuring process has problems in that it is difficult to implement a material capable of securing mechanical properties, laser processability, and appearance characteristics.

Therefore, in order to overcome these problems, there is a need for a thermoplastic resin composition which has excellent stiffness, impact resistance, and fluidity while allowing laser direct structuring.

SUMMARY OF THE INVENTION

Embodiments include a thermoplastic resin composition for laser direct structuring which includes a thermoplastic resin, a laser direct structuring additive allowing laser direct structuring, and an olefin copolymer and a molded article using the same. The thermoplastic resin composition can provide stiffness, flexibility, impact resistance and/or excellent appearance.

In exemplary embodiments, the thermoplastic resin composition includes: (A) a thermoplastic resin; (B) a laser direct structuring additive; and (C) an olefin copolymer.

In another embodiment, the thermoplastic resin composition for laser direct structuring may further include (D) inorganic fillers.

In the thermoplastic resin composition, the olefin copolymer (C) may be present in an amount of about 1 part by weight to about 20 parts by weight based on about 100 parts by weight of the thermoplastic resin (A), the laser direct structuring additive (B), and the inorganic fillers (D).

The thermoplastic resin composition may include about 60 wt % to about 95 wt % of the thermoplastic resin (A), about 1 wt % to about 20 wt % of the laser direct structuring additive (B), and about 1 wt % to about 35 wt % of the inorganic fillers (D).

A weight ratio of the laser direct structuring additive (B) to the inorganic fillers (D) may range from about 1:1 to about 1:6.

The olefin copolymer (C) may be a graft copolymer having a polyolefin backbone.

The olefin copolymer (C) may contain a functional group in the polyolefin backbone, wherein the functional group may include a (meth)acrylate group, a modified ester group, an arylate group, an acrylonitrile group, or a combination thereof.

The polyolefin backbone may include polyethylene, polypropylene, or an ethylene-propylene copolymer.

The functional group may be present in an amount of about 5 wt % to about 50 wt % based on the total weight of the olefin copolymer (C).

The thermoplastic resin (A) may include a polycarbonate resin, a polyester resin, a polyamide resin, a polyarylene ether resin, a polyphenylene oxide resin, a polystyrene resin, or a combination thereof.

The laser direct structuring additive (B) may include a metal oxide.

The metal oxide may include a copper-containing metal oxide, a zinc-containing metal oxide, a tin-containing metal oxide, a magnesium-containing metal oxide, an aluminum-containing metal oxide, a gold-containing metal oxide, a silver-containing metal oxide, a cadmium-containing metal oxide, a manganese-containing metal oxide, a nickel-containing metal oxide, a cobalt-containing metal oxide, a titanium-containing metal oxide, an iron-containing metal oxide, a chromium-containing metal oxide, or a combination thereof.

The laser direct structuring additive (B) may include a material having a spinel structure.

The inorganic fillers (D) may be glass fibers having a cross-sectional aspect ratio of less than about 4.0.

Other embodiments include a molded article including the thermoplastic resin composition as set forth above.

The molded article may have an Izod impact strength (⅛" Notched) of about 20 kgf·cm/cm to about 60 kgf·cm/cm, as measured in accordance with ASTM D256, and a melt flow index (250° C., 10 kg) of about 20 g/10 min to about 60 g/10 min, as measured in accordance with ASTM D1238.

The molded article may have a fogging index of about 0.8 or less, as calculated according to Equation 1:

$$\text{Fogging index (FI)} = (W1/W0) \times 100 \quad \text{[Equation 1]}$$

wherein W1 is the weight of unreacted monomers and oligomers deposited on a lid after placing 10 g of the thermoplastic resin composition in a soda-lime petri dish having a diameter of about 55 mm, putting a lid on the dish and sealing the dish, and leaving the dish at 270° C. for about 180 minutes; and W0 is the initial weight of the thermoplastic resin composition.

The molded article may have a plated pattern formed on the entirety or part of a surface thereof (i.e., a portion of or the entire surface of the molded article may include the plated pattern).

Other embodiments include a method for manufacturing a molded article, wherein the method may include: preparing a preform by molding the thermoplastic resin composition as set forth above; forming a pattern area by irradiating a surface of the preform with laser beams; and forming a plated pattern on the pattern area by plating the preform with the pattern area formed thereon.

DETAILED DESCRIPTION

The above and other aspects, features, and advantages of the present invention will become apparent from the detailed description of the following embodiments in conjunction with the accompanying drawings. It should be understood that the present invention is not limited to the following embodiments and may be embodied in different ways by those skilled in the art without departing from the scope of the present invention. Rather, the embodiments are provided for complete disclosure and to provide thorough understanding of the present invention by those skilled in the art. The scope of the present invention should be defined only by the appended claims.

Unless otherwise defined herein, all terms including technical or scientific terms used herein have the same meanings as commonly understood by those skilled in the art to which the present invention pertains. It will be further understood that terms, such as those defined in commonly used dictionaries, should not be interpreted in an idealized or overly formal sense unless expressly so defined herein.

The present invention relates to a thermoplastic resin composition for laser direct structuring and a molded article formed using the same.

In exemplary embodiments, a thermoplastic resin composition for laser direct structuring includes: (A) a thermoplastic resin; (B) a laser direct structuring additive; and (C) an olefin copolymer. These components can provide excellent properties in terms of stiffness, laser processability, and fluidity.

The thermoplastic resin composition for laser direct structuring may further include (D) inorganic fillers.

The thermoplastic resin composition may include about 60% by weight (wt %) to about 95 wt % of the thermoplastic resin (A), about 1 wt % to about 20 wt % of the laser direct structuring additive, and about 1 wt % to about 35 wt % of inorganic fillers (D). For example, the thermoplastic resin composition may include about 70 wt % to about 90 wt % of the thermoplastic resin (A), about 1 wt % to about 10 wt % of the laser direct structuring additive (B), and about 5 wt % to about 25 wt % of the inorganic fillers (D). Within this content range, the thermoplastic resin composition can maximize strength and fluidity of a molded article.

Now, each component of the thermoplastic resin composition for laser direct structuring according to the present invention will be described in more detail.

(A) Thermoplastic Resin

The thermoplastic resin (A) may include any material having thermoplasticity. Examples of the thermoplastic resin (A) may include without limitation polycarbonate resins, polyester resins, polyamide resins, polyarylene ether resins, polyphenylene oxide resins, polystyrene resins, and the like, and combinations thereof. For example, the thermoplastic resin (A) may be a polycarbonate resin.

A polycarbonate resin according to exemplary embodiments may include an aromatic polycarbonate resin prepared by reacting phosgene, a halogen formate or a carbonate diester with one or more diphenols represented by the following Formula 1:

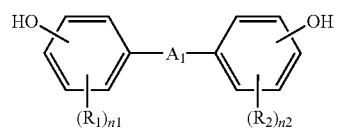

wherein A is a single bond, a substituted or unsubstituted $C_1$ to $C_5$ alkylene group, a substituted or unsubstituted $C_1$ to $C_5$ alkylidene group, a substituted or unsubstituted $C_3$ to $C_6$ cycloalkylene group, a substituted or unsubstituted $C_5$ to $C_6$ cycloalkylidene group, —CO—, —S—, or —$SO_2$—; $R_1$ and $R_2$ are the same or different and are each independently a substituted or unsubstituted $C_1$ to $C_{30}$ alkyl group or a substituted or unsubstituted $C_6$ to $C_{30}$ aryl group; and $n_1$ and $n_2$ are the same or different and are each independently an integer from 0 to 4.

As used herein, unless otherwise defined, the term "substituted" means that a hydrogen atom is substituted with at least one substituent such as a halogen group, a $C_1$ to $C_{30}$ alkyl group, a $C_1$ to $C_{30}$ haloalkyl group, a $C_6$ to $C_{30}$ aryl group, a $C_2$ to $C_{30}$ heteroaryl group, a $C_1$ to $C_{20}$ alkoxy group, or a combination thereof. Also as used herein, unless otherwise defined, the term "hetero" refers to one or more of an oxygen atom (O), a nitrogen atom (N), a sulfur atom (S), a phosphorous atom (P), and the like or a mixture thereof.

Examples of the diphenols may include without limitation hydroquinone, resorcinol, 4,4'-dihydroxyphenyl, 2,2-bis-(4-hydroxyphenyl)-propane, 2,4-bis-(4-hydroxyphenyl)-2-methylbutane, 1,1 -bis-(4-hydroxyphenyl)-cyclohexane, 2,2-bis-(3-chloro-4-hydroxyphenyl)-propane, 2,2-bis-(3,5-dichloro-4-hydroxyphenyl)-propane, and the like, and combinations thereof. For example, the diphenol may include 2,2-bis-(4-hydroxyphenyl)-propane, 2,2-bis-(3,5-dichloro-4-hydroxyphenyl)-propane, and/or 1,1-bis-(4-hydroxyphenyl)-cyclohexane, without being limited thereto. In exemplary embodiments, the diphenol may include 2,2-bis-(4-hydroxyphenyl)-propane, which is also referred to as bisphenol A.

The polycarbonate resin may have a weight average molecular weight (Mw) of about 10,000 g/mol to about 200,000 g/mol, for example about 15,000 g/mol to about 80,000 g/mol, without being limited thereto.

The polycarbonate resin may include a branched polycarbonate resin, for example a polycarbonate resin prepared by adding about 0.05 mol % to about 2 mol % of a polyfunctional compound containing tri- or higher functional groups, for example, tri- or higher-valent phenol groups, based on the total amount of the diphenols used in polymerization.

The polycarbonate resin may be used in the form of a homo-polycarbonate resin, a co-polycarbonate resin, or blends thereof.

In addition, the polycarbonate resin may be partially or completely replaced by an aromatic polyester-carbonate resin obtained by polymerization in the presence of an ester precursor, for example, a bifunctional carboxylic acid.

The thermoplastic resin composition for laser direct structuring may include the thermoplastic resin (A) in an amount of about 60 wt % to about 95 wt %, for example about 70 wt % to about 90 wt %, based on the total weight (100 wt %) of the thermoplastic resin (A), the laser direct structuring additive (B), and the inorganic fillers (D). In some embodiments, the thermoplastic resin composition for laser direct structuring may include the thermoplastic resin (A) in an amount of about 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, or 95 wt %. Further, according to some embodiments of the present invention, the thermoplastic resin (A) may be present in an amount of from about any of the foregoing amounts to about any other of the foregoing amounts.

Within this range, the thermoplastic resin composition can maintain excellent moldability and platability when mixed with the other components.

(B) Laser Direct Structuring Additive

Laser direct structuring is one of methods for forming a plated pattern on a molded product and includes forming a product using a resin containing a laser direct structuring additive, and irradiating a surface of the product with laser beams. As used herein, a portion of the surface struck by the beams undergoes a chemical change, which is caused by a process in which metal atoms in the laser direct structuring additive are activated by the laser beams. The activated metal atoms serve as plating seeds which allow a plated pattern to be formed on the product by electroless plating.

The laser direct structuring additive (B) may include any material having functions for laser direct structuring. For example, the laser direct structuring additive may include metal oxides, such as but not limited to a copper-containing metal oxide, a zinc-containing metal oxide, a tin-containing metal oxide, a magnesium-containing metal oxide, an aluminum-containing metal oxide, a gold-containing metal oxide, a silver-containing metal oxide, a cadmium-containing metal oxide, a manganese-containing metal oxide, a nickel-containing metal oxide, a cobalt-containing metal oxide, a titanium-containing metal oxide, an iron-containing metal oxide, a chromium-containing metal oxide, and the like, and combinations thereof. For example, the laser direct structuring additive (B) may be a copper-containing metal oxide, without being limited thereto.

In addition, the laser direct structuring additive (B) may include a material having a spinel structure. For example, the laser direct structuring additive may include a metal oxide having a spinel structure, such as but not limited to a copper-containing metal oxide, a zinc-containing metal oxide, a tin-containing metal oxide, a magnesium-containing metal oxide, an aluminum-containing metal oxide, a gold-containing metal oxide, a silver-containing metal oxide, a cadmium-containing metal oxide, a manganese-containing metal oxide, a nickel-containing metal oxide, a cobalt-containing metal oxide, a titanium-containing metal oxide, an iron-containing metal oxide, and/or a chromium-containing metal oxide, each of which has a spinel structure, or a combination thereof.

The spinel structure refers to a crystal structure of a compound represented by Formula $AB_2X_4$, with X arranged in a cubic close-packed lattice and B and A respectively occupying the octahedral and tetrahedral sites in the lattice. The spinel structure is an optimum structure for maximizing laser processability.

As used herein, A may be copper, zinc, tin, magnesium, aluminum, gold, or silver, and B may be cadmium, manganese, nickel, zinc, copper, cobalt, magnesium, tin, titanium, iron, aluminum, or chromium, without being limited thereto.

As used herein, any divalent metal cations may be used as "A" and/or any trivalent metal cations may be used as "B".

X may be oxygen, without being limited thereto.

Advantageously, use of a synthetic resin including the laser direct structuring additive allows a circuit pattern to be implemented in a desired form by direct laser processing of the resin, and does not require any chemicals used in electroplating, thereby reducing the number of processes.

The thermoplastic resin composition for laser direct structuring may include the laser direct structuring additive (B) in an amount of about 1 wt % to about 20 wt %, for example about 1 wt % to about 10 wt %, based on the total weight (100 wt %) of the thermoplastic resin (A), the laser direct structuring additive (B), and the inorganic fillers (D). In some embodiments, the thermoplastic resin composition for laser direct structuring may include the laser direct structuring additive (B) in an amount about 1, 2, 3, 4, 5, 6, 7, 8, 9, 10, 11, 12, 13, 14, 15, 16, 17, 18, 19, or 20 wt %. Further, according to some embodiments of the present invention, the laser direct structuring additive (B) may be present in an amount of from about any of the foregoing amounts to about any other of the foregoing amounts.

Within this range, the molded article can allow application of laser direct structuring and can have excellent impact resistance and platability.

(C) Olefin Copolymer

The olefin copolymer (C) (which is not the same as the thermoplastic resin (A)) used in the thermoplastic resin composition may be a graft copolymer having a polyolefin backbone. The olefin copolymer may be a copolymer having a polyolefin backbone with a functional group grafted thereto.

The olefin copolymer (C) may contain a functional group such as a (meth)acrylate group, a modified ester group, an arylate group, an acrylonitrile group, or a combination thereof on a polyolefin backbone. The polyolefin backbone may include polyethylene, polypropylene, or an ethylene-propylene copolymer. In exemplary embodiments, the backbone of the modified polyolefin may include about 70 wt % to about 100 wt % of polyethylene, polypropylene, or an ethylene-propylene copolymer.

The functional group may include a functional group having partial compatibility with a polycarbonate resin. For example, the functional group may include an acrylate group such as methyl acrylate, ethyl acrylate, and/or butyl acrylate, a modified ester group such as ethylene glycol, an arylate group, an acrylonitrile group, and the like.

In exemplary embodiments, olefin copolymer (C) may include the functional group in an amount of about 5 wt % to about 50 wt %, for example about 5 wt % to about 40 wt %, based on the total weight (100 wt %) of the olefin copolymer (C). In some embodiments, the olefin copolymer (C) can include the functional group in an amount of about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 wt % based on the total weight (100 wt %) of the olefin copolymer (C). In addition, the functional group may be present in an amount of from about any of the above numerical values to about any other of the above numerical values in the olefin copolymer (C). Within this range, it is possible to maximize impact resistance of the molded article and fluidity of the thermoplastic resin composition.

The thermoplastic resin composition for laser direct structuring may include the olefin copolymer (C) in an amount of about 1 part by weight to about 20 parts by weight, for example about 3 parts by weight to about 10 parts by weight, and as another example about 4 parts by weight to about 7 parts by weight, based on about 100 parts by weight of the thermoplastic resin (A), the laser direct structuring additive (B), and the inorganic fillers (D). In some embodiments, the thermoplastic resin composition for laser direct structuring may include the olefin copolymer (C) in an amount about 2, 3, 4, 5, 6, 7, 8, 9, 10, 11, 12, 13, 14, 15, 16, 17, 18, 19, or 20 parts by weight based on about 100 parts by weight of the thermoplastic resin (A), the laser direct structuring additive (B), and the inorganic fillers (D). In addition, in the thermoplastic resin composition for laser direct structuring, the olefin copolymer (C) may be present in an amount of from about any of the above numerical values to about any other of the above numerical values based on about 100 parts by weight of (A)+(B)+(D). Within this range, the thermoplastic resin composition can have enhanced fluidity, and the molded article can have excellent mechanical properties.

(D) Inorganic Fillers

The inorganic fillers (D) used in the thermoplastic resin composition may include inorganic materials capable of reinforcing stiffness of the thermoplastic resin. For example, the inorganic fillers (D) may be glass fibers.

The glass fibers may include typical glass fibers. The glass fibers may have a diameter of about 5 μm to about 20 μm and a length of about 1.5 mm to about 8 mm. For example, the glass fibers may have a diameter of about 8 μm to about 15 μm and a length of about 2 mm to about 5 mm. Within this range of diameter, the glass fibers can provide impact-modifying effects in the thermoplastic resin composition. When the length of the glass fibers is in the above range, the thermoplastic resin composition can be easily introduced into a forming extruder, thereby enhancing productivity.

The glass fibers may be used in a mixture with fibers selected from the group consisting of basalt fibers, fibers prepared from biomass, and the like, and combinations thereof.

The glass fibers may have an average ratio of diameter to length of about 1:75 to about 1:1600, for example about 1:200 to about 1:500. Within this range, it is possible to maximize impact-modifying effects of the thermoplastic resin composition while enhancing productivity. As used herein, the average ratio of diameter to length of the glass fibers refers to a value obtained by averaging ratios of diameter to length of all of the glass fibers.

The glass fibers may have a circular cross-sectional shape, an elliptical cross-sectional shape, a cross-sectional rectangular shape, and/or a dumbbell cross-sectional shape having two circles connected to each other. For example, the glass fibers may have a circular cross-sectional shape and/or an elliptical cross-sectional shape.

The glass fibers may be subjected to surface treatment with specific glass fiber treatment agents so as to prevent reaction with the thermoplastic resin, such as a polycarbonate resin, and to enhance wettability. Surface treatment may be performed in fabrication of the glass fibers or in post-processing.

The glass fiber treatment agents may include lubricants, coupling agents, surfactants, and the like, and combinations thereof. The lubricants are used to form strands having a constant diameter or thickness in fabrication of the glass fibers, and the coupling agents are used to provide good adhesion between the glass fibers and the resin. When such glass fiber treatment agents are properly selected depending upon kinds of the resin and glass fibers, it is possible to impart good properties to a glass fiber-reinforced material.

The glass fibers may have a cross-sectional aspect ratio of less than about 4.0. For example, the glass fibers may have a cross-sectional aspect ratio of less than about 2.0, and as another example from about 1 to about 1.5. As used herein, the cross-sectional aspect ratio of the glass fibers refers to a value obtained by averaging ratio values of diameter of the longest axis to diameter of the shortest axis of all of the glass fibers.

Glass fibers having a circular shape in section and glass fibers having an elliptical shape in section may be mixed in a weight ratio of about 0.25:1 to about 2:1, for example about 0.5:1 to about 2:1, where applicable. Within this range of weight ratio, it is possible to enhance dimensional stability of the thermoplastic resin composition for laser direct structuring.

The thermoplastic resin composition for laser direct structuring may include the inorganic fillers (D) in an amount of about 1 wt % to about 35 wt %, for example about 5 wt % to about 25 wt %, based on the total weight (100 wt %) of the thermoplastic resin (A), the laser direct structuring additive (B), and the inorganic fillers (D). In some embodiments, the thermoplastic resin composition can include the inorganic fillers (D) in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, or 35 wt %. Further, according to some embodiments of the present invention, the inorganic fillers (D) may be present in an amount of from about any of the foregoing amounts to about any other of the foregoing amounts.

Within this range, the molded article can have enhanced stiffness and exhibit good balance between physical properties.

In the thermoplastic resin composition for laser direct structuring, a weight ratio of the laser direct structuring additives (B) to the inorganic fillers (D) may range from about 1:1 to about 1:6. Within this range, the molded article can exhibit good balance between heat resistance, platability, and stiffness.

Embodiments also include a molded article formed of the thermoplastic resin composition for laser direct structuring as set forth above. The molded article may have a plated pattern formed on the entirety or part of a surface thereof. The molded article including the thermoplastic resin composition for laser direct structuring may be applied to various industrial fields such as a variety of electric/electronic products, and automotive parts.

The molded article may have an Izod impact strength (⅛" Notched) of about 20 kgf·cm/cm to about 60 kgf·cm/cm, for example about 20 kgf·cm/cm to about 40 kgf·cm/cm, as measured in accordance with ASTM D256. In some embodiments, the molded article may have an Izod impact strength (⅛" Notched) of about 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59 or 60 kgf. cm/cm, as measured in accordance with ASTM D256. In addition, the molded article may have an Izod impact strength (⅛" Notched) of from about any of the above numerical values to about any other of the above numerical values, as measured in accordance with ASTM D256. Within this range, the thermoplastic resin composition can realize excellent laser processability while exhibiting good mechanical properties and fluidity.

The molded article may have a melt flow index (250° C., 10 kg) of about 20 g/10 min to about 60 g/10 min, for example about 24 g/10 min to about 35 g/10 min, as measured in accordance with ASTM D1238. In some embodiments, the molded article may have a melt flow index (250° C., 10 kg) of about 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59 or 60 g/min, as measured in accordance with ASTM D1238. In addition, the molded article may have melt flow index (250° C., 10 kg) of from about any of the above numerical values to about any other of the above numerical values, as measured in accordance with ASTM D1238. Within this range, the thermoplastic resin composition can realize excellent laser processability while exhibiting good mechanical properties and fluidity.

In addition, the molded article may have a fogging index of about 0.8 or less, as calculated according to the following Equation 1. For example, the molded article may have a fogging index of about 0.1 to about 0.8, and as another example about 0.1 to about 0.3, as calculated according to the following Equation 1:

[Equation 1]

$$\text{Fogging index (FI)}=(W1/W0)\times 100 \quad (1)$$

wherein W1 is the weight of unreacted monomers and oligomers deposited on a lid after placing 10 g of the thermoplastic resin composition for laser direct structuring in a soda-lime petri dish having a diameter of about 55 mm, putting a lid on the dish and sealing the dish, and leaving the dish at 270° C. for about 180 minutes; and W0 is the initial weight of the thermoplastic resin composition for laser direct structuring.

As used herein, the fogging index (FI) refers to the amount of unreacted monomers and oligomers per unit weight (10 g) of the thermoplastic resin composition for laser direct structuring, as calculated by a process of placing a small amount of the thermoplastic resin composition for laser direct structuring in a soda-lime petri dish having a diameter of about 55 mm, putting a lid on the dish and sealing the dish, and leaving the dish at 270° C. for about 180 minutes, followed by measurement of the weight of organic materials (unreacted monomers and oligomers, fogging) deposited on the lead and then dividing the measured value by a measured initial weight of the thermoplastic resin composition for laser direct structuring. As used herein, the oligomers refer to oligomers which have a weight average molecular weight of about 6,000 g/mol or less, as measured by gel permeation chromatography (GPC). When the molded article has a fogging index (FI) of about 0.8 or less, the molded article can have excellent impact resistance. In addition, when the molded article has a fogging index (FI) in the above range, it is possible to reinforce stiffness and fluidity with minimal or no deterioration in other properties when the olefin copolymer and the glass fibers are included in the composition.

Other embodiments provide a method for manufacturing a molded article, wherein the method may include preparing a preform by molding the thermoplastic resin composition, forming a pattern area by irradiating a surface of the preform with laser beams, and forming a plated pattern on the pattern area by plating the preform with the pattern area formed thereon. The preform may be prepared by extrusion, injection molding, blow molding, or calendar molding, without being limited thereto.

The preform may be plated by electroplating or electroless plating. For example, the preform may be plated by electroless plating.

Hereinafter, the present invention will be described in more detail with reference to the following examples. It should be understood that these examples are provided for illustration only and are not to be construed in any way as limiting the present invention.

Details of (A) a thermoplastic resin, (B) a laser direct structuring additive, (C) an olefin copolymer, and (D) inorganic fillers used in the following Examples and Comparative Examples are as follows:

(A) Thermoplastic Resin

In the following Examples and Comparative Examples, a middle viscosity polycarbonate resin (L-1225WX, TEIJIN CHEMICALS) is used.

(B) Laser Direct Structuring Additive

In the following Examples and Comparative Examples, a copper-chromium oxide spinel (Black 1G SHEPHERD Color Company) is used.

(C) Olefin Copolymer

In the following Examples and Comparative Examples, an ethylene/methyl acrylate copolymer (Elvaloy® AC1330, DUPONT) is used.

(C') MBS Copolymer (Methyl Methacrylate-Butadiene-Styrene Copolymer)

In the following Comparative Examples, a methyl methacrylate-butadiene-styrene copolymer (Metablen s-2100, MITSUBISHI RAYON Co., Ltd.) is used.

(D) Inorganic Fillers

In the following Examples and Comparative Examples, glass fibers (910, OWENS CORNING Fiberglas Corp.) are used.

The components are added in amounts as listed in Table 1 and dry-mixed, followed by extrusion at a nozzle temperature of 250° C. to 310° C. using a twin screw extruder (φ=36 mm), thereby preparing pellets. The prepared pellets are dried at 80° C. for 4 hours or more, thereby preparing a specimen for evaluation.

TABLE 1

|  | Example 1 | Example 2 | Comparative Example 1 | Comparative Example 2 | Comparative Example 3 | Comparative Example 4 | Comparative Example 5 | Comparative Example 6 |
|---|---|---|---|---|---|---|---|---|
| (A) Thermoplastic resin | 85 | 65 | 90 | 90 | 90 | 85 | 85 | 65 |
| (B) Laser direct structuring additives | 5 | 5 | — | — | — | 5 | 5 | 5 |
| (C) Olefin copolymer | 4 | 4 | — | 4 | — | — | — | — |
| (C') MBS copolymer | — | — | — | — | 4 | — | 4 | — |
| (D) Inorganic fillers | 10 | 30 | 10 | 10 | 10 | 10 | 10 | 30 |

In Table 1, the amounts of the (A) thermoplastic resin, the (B) laser direct structuring additive, and the (D) inorganic fillers are represented by % by weight, and the (C) olefin copolymer and the (C') MBS copolymer are represented by parts by weight based on 100 parts by weight of the (A) thermoplastic resin, the (B) laser direct structuring additive, and the (D) inorganic fillers.

Each of the specimens prepared in Examples and Comparative examples is evaluated as to impact strength, flexural modulus, melt flow index, and melt flow length. Results are shown in Table 2.

Property Evaluation (1) Izod impact strength (unit: kgf·cm/cm): Izod impact strength is measured on a ⅛" thick notched Izod specimen in accordance with ASTM D256.

(2) Flexural modulus (2.8 mm/min): Flexural modulus is measured at 2.8 mm/min in accordance with ASTM D790.

(3) Melt flow index: Melt flow index is measured at 250° C./10 kg in accordance with ASTM D1238.

(4) Melt flow length: Melt flow length is measured on specimens obtained by injection molding of the prepared pellets under conditions of a cylinder/mold temperature of 300° C./80° C. and a pressure/speed of 50%/50% using an electric molding machine (JSW 140AD) and a spiral mold (t=1 mm).

TABLE 2

|  | Example 1 | Example 2 | Comparative Example 1 | Comparative Example 2 | Comparative Example 3 | Comparative Example 4 | Comparative Example 5 | Comparative Example 6 |
|---|---|---|---|---|---|---|---|---|
| Izod impact strength (kgf · cm/cm) | 22 | 21 | 16 | 29 | 28 | 13 | 20 | 11 |
| Flexural modulus (2.8 mm/min) | 37300 | 70000 | 39000 | 37800 | 36700 | 39300 | 37300 | 73000 |
| Melt flow index (g/10 min) | 26 | 24 | 20 | 23 | 14 | 23 | 18 | 20 |
| Melt flow length (nm) | 150 | 143 | 140 | 150 | 137 | 141 | 135 | 135 |
| Fogging index | 0.3 | 0.2 | 0.2 | 0.2 | 0.5 | 0.2 | 0.6 | 0.2 |

From the results of Table 2, it can be seen that the thermoplastic resin compositions of Examples 1 and 2 according to the present invention have excellent properties in terms of impact strength, flexural modulus, fluidity, and fogging index.

Conversely, it can be seen that the thermoplastic resin compositions of Comparative Examples 1, 4, and 6 not using an impact modifier such as the olefin copolymer (C) and the MBS copolymer (C') have considerably low impact strength.

In addition, it can be seen that the thermoplastic resin compositions of Comparative Examples 3 and 5 using the MBS copolymer (C') as an impact modifier, unlike the thermoplastic resin compositions of Examples 1 and 2 using the olefin copolymer (C), have considerably poor fluidity and significantly high fogging index.

Since the presence of an impact modifier can promote generation of gases, the thermoplastic resin compositions of Comparative Examples 1, 4, and 6 not using an impact modifier have low fogging index. However, the thermoplastic resin compositions of Examples 1 and 2 according to the present invention exhibit low fogging index despite including an impact modifier.

Therefore, it can be seen that the thermoplastic resin composition according to the present invention prepared form the components as set forth above in the aforementioned content ratio can exhibit excellent impact resistance and fluidity and thus has critical significance.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A thermoplastic resin composition for laser direct structuring, comprising: (A) a thermoplastic resin; (B) a laser direct structuring additive; (C) an olefin copolymer, and (D) inorganic fillers, wherein the olefin copolymer (C) is present in an amount of about 1 part by weight to about 20 parts by weight based on about 100 parts by weight of the thermoplastic resin (A), the laser direct structuring additive (B), and the inorganic fillers (D).

2. The thermoplastic resin composition according to claim 1, comprising: about 60 wt % to about 95 wt % of the thermoplastic resin (A), about 1 wt % to about 20 wt % of the laser direct structuring additive (B), and about 1 wt % to about 35 wt % of the inorganic fillers (D), each based on the total weight of (A)+(B)+(D).

3. The thermoplastic resin composition according to claim 1, wherein a weight ratio of the laser direct structuring additive (B) to the inorganic fillers (D) ranges from about 1:1 to about 1:6.

4. The thermoplastic resin composition according to claim 1, wherein the olefin copolymer (C) is a graft copolymer having a polyolefin backbone.

5. The thermoplastic resin composition according to claim 4, wherein the olefin copolymer (C) includes a functional group grafted onto the polyolefin backbone, the functional group comprising a (meth)acrylate group, a modified ester group, an arylate group, an acrylonitrile group, or a combination thereof.

6. The thermoplastic resin composition according to claim 4, wherein the polyolefin backbone comprises polyethylene, polypropylene, or an ethylene-propylene copolymer.

7. The thermoplastic resin composition according to claim 5, wherein the functional group is present in an amount of about 5 wt % to about 50 wt % based on the total weight of the olefin copolymer (C).

8. The thermoplastic resin composition according to claim 1, wherein the thermoplastic resin (A) comprises a polycarbonate resin, a polyester resin, a polyamide resin, a polyarylene ether resin, a polyphenylene oxide resin, a polystyrene resin, or a combination thereof.

9. The thermoplastic resin composition according to claim 1, wherein the laser direct structuring additive (B) comprises a metal oxide.

10. The thermoplastic resin composition according to claim 9, wherein the metal oxide comprises a copper-containing metal oxide, a zinc-containing metal oxide, a tin-containing metal oxide, a magnesium-containing metal oxide, an aluminum-containing metal oxide, a gold-containing metal oxide, a silver-containing metal oxide, a cadmium-containing metal oxide, a manganese-containing metal oxide, a nickel-containing metal oxide, a cobalt-containing metal oxide, a titanium-containing metal oxide, an iron-containing metal oxide, a chromium-containing metal oxide, or a combination thereof.

11. The thermoplastic resin composition according to claim 1, wherein the laser direct structuring additive (B) comprises a material having a spinel structure.

12. The thermoplastic resin composition according to claim 1, wherein the inorganic fillers (D) are glass fibers having a cross-sectional aspect ratio of less than about 4.0.

13. A molded article comprising the thermoplastic resin composition according to claim 1.

14. The molded article according to claim 13, wherein the molded article has an Izod impact strength (⅛" Notched) of about 20 kgf·cm/cm to about 60 kgf·cm/cm, as measured in accordance with ASTM D256, and a melt flow index (250° C., 10 kg) of about 20 g/10 min to about 60 g/10 min, as measured in accordance with ASTM D1238.

15. The molded article according to claim 13, wherein the molded article has a fogging index of about 0.8 or less, as calculated according to Equation 1:

$$\text{Fogging index (FI)}=(W1/W0)\times 100 \quad [\text{Equation 1}]$$

wherein W1 is the weight of unreacted monomers and oligomers deposited on a lid after placing 10 g of the thermoplastic resin composition according to any one of claims 1 to 11 in a soda-lime petri dish having a diameter of about 55 mm, putting a lid on the dish and sealing the dish, and leaving the dish at 270° C. for about 180 minutes; and W0 is the initial weight of the thermoplastic resin composition according to any one of claims 1 to 11.

16. The molded article according to claim 13, wherein the molded article has a plated pattern formed on the entirety or part of a surface thereof.

17. A method for manufacturing a molded article, comprising:
preparing a preform by molding the thermoplastic resin composition according to claim 1;
forming a pattern area by irradiating a surface of the preform with laser beams; and
forming a plated pattern on the pattern area by plating the preform with the pattern area formed thereon.

18. The thermoplastic resin composition according to claim 1, wherein a molded article comprising the thermoplastic resin composition has an Izod impact strength (⅛" Notched) of about 20 kgf·cm/cm to about 60 kgf·cm/cm, as measured in accordance with ASTM D256; a melt flow index (250° C., 10 kg) of about 20 g/10 min to about 60 g/10 min, as measured in accordance with ASTM D1238; and a fogging index of about 0.8 or less, as calculated according to Equation 1:

$$\text{Fogging index (FI)}=(W1/W0)\times 100 \quad [\text{Equation 1}]$$

wherein W1 is the weight of unreacted monomers and oligomers deposited on a lid after placing 10 g of the thermoplastic resin composition in a soda-lime petri dish having a diameter of about 55 mm, putting a lid on the dish and sealing the dish, and leaving the dish at 270° C. for about 180 minutes; and W0 is the initial weight of the thermoplastic resin composition.

19. The thermoplastic resin composition according to claim 18, wherein a molded article comprising the thermoplastic resin composition has a melt flow index of 24 g/10 min to 35 g/10 min and a fogging index of about 0.1 to about 0.3.

20. The thermoplastic resin composition according to claim 19, comprising: about 65 wt % to about 85 wt % of the thermoplastic resin (A), about 1 wt % to about 10 wt % of the laser direct structuring additive (B), about 5 wt % to about 30 wt % of the inorganic fillers (D), each based on the total weight of (A)+(B)+(D), and about 3 to about 10 parts by weight of the olefin copolymer (C) based on about 100 parts by weight of (A)+(B)+(D).

21. The thermoplastic resin composition according to claim 20, wherein the thermoplastic resin (A) comprises a polycarbonate resin, the laser direct structuring additive (B) comprises a copper-containing metal oxide and/or a chromium-containing metal oxide having a spinel structure; the inorganic fillers (D) comprises glass fibers; and the olefin copolymer (C) comprises a graft copolymer having a polyolefin backbone and a (meth)acrylate functional group grafted onto the polyolefin backbone.

* * * * *